(12) United States Patent
Park

(10) Patent No.: US 7,058,756 B2
(45) Date of Patent: Jun. 6, 2006

(54) CIRCUIT FOR IMPLEMENTING SPECIAL MODE IN PACKET-BASED SEMICONDUCTOR MEMORY DEVICE

(75) Inventor: Nak Kyu Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 371 days.

(21) Appl. No.: 10/331,400

(22) Filed: Dec. 30, 2002

(65) Prior Publication Data

US 2003/0163636 A1    Aug. 28, 2003

(30) Foreign Application Priority Data

Feb. 26, 2002  (KR) ................... 10-2002-0010129

(51) Int. Cl.
*G11C 7/10* (2006.01)
(52) U.S. Cl. .................... 711/105; 711/5; 711/211; 365/189.05
(58) Field of Classification Search ........... 365/189.05, 365/23.08
See application file for complete search history.

(56) References Cited

U.S. PATENT DOCUMENTS

| | | | |
|---|---|---|---|
| 5,072,138 A | 12/1991 | Slemmer et al. | |
| 5,367,649 A * | 11/1994 | Cedar | 712/208 |
| 5,367,655 A | 11/1994 | Grossman et al. | |
| 5,659,508 A | 8/1997 | Lamphier et al. | |
| 5,973,991 A * | 10/1999 | Tsuchida et al. | 365/233 |
| 6,085,284 A * | 7/2000 | Farmwald et al. | 711/105 |
| 6,178,126 B1 * | 1/2001 | Kirihata et al. | 365/200 |
| 6,633,947 B1 * | 10/2003 | Holman et al. | 711/5 |
| 6,766,383 B1 * | 7/2004 | Pan et al. | 710/22 |

* cited by examiner

*Primary Examiner*—Donald Sparks
*Assistant Examiner*—Hashem Farrokh
(74) *Attorney, Agent, or Firm*—Ladas & Parry LLP

(57) ABSTRACT

Disclosed is a circuit for implementing a special mode in a packet-based semiconductor memory device, which performs the special mode in the same manner as a normal operation without changing the semiconductor memory devie from a special mode register to a control register mode prior to a normal operation or at the middle of the normal operation after an initial operation having a reset operation. A packet receiving part receives external packet data. A register controller generates a control signal to select a special mode register according to a value of a first field among the external packet data received by the packet receiving part. A register value generator generates a value of the special mode register selected by the control signal from the register controller according to a value of a second field among the received external packet data when the register controller generates the control signal.

16 Claims, 5 Drawing Sheets

FIG.3

RsvB,XOP43:The value of SMR, XOP210:XX1:SMR SET
　　　　　　　　　　　　　　　　XOP210:001:SMR1
　　　　　　　　　　　　　　　　XOP210:011:SMR2
　　　　　　　　　　　　　　　　XOP210:101:SMR3
　　　　　　　　　　　　　　　　XOP210:111:SMR4

FIG.4

RsvB,XOP4:The value of SMR, XOP3210:XXX1:SMR Set
　　　　　　　　　　　　　　　　XOP3210:0001:SMR1
　　　　　　　　　　　　　　　　XOP3210:0011:SMR2
　　　　　　　　　　　　　　　　XOP3210:0101:SMR3
　　　　　　　　　　　　　　　　XOP3210:0111:SMR4
　　　　　　　　　　　　　　　　XOP3210:1001:SMR5
　　　　　　　　　　　　　　　　XOP3210:1011:SMR6
　　　　　　　　　　　　　　　　XOP3210:1101:SMR7
　　　　　　　　　　　　　　　　XOP3210:1111:SMR8

CIRCUIT FOR IMPLEMENTING SPECIAL MODE IN PACKET-BASED SEMICONDUCTOR MEMORY DEVICE

BACKGROUND OF THE INVENTION

1. Field of the Invention

The present invention relates to a semiconductor memory device, and more particularly to a circuit for implementing a special mode in a packet-based semiconductor memory device. The present invention is used for a Rambus dynamic random access memory (referred to as a "DRAM" hereinafter) or a packet-based semiconductor memory device.

2. Description of the Prior Art

As generally known in the art, a dynamic random access memory (referred to as a "DRAM" hereinafter) is an element which transmits or receives a digital signal through a bus according to the request of a central processing unit (CPU). Accordingly, a DRAM which does not have a bus transmission function is not useful. DRAM interfaces have been focused on an optimization of an electric signal transmission of a DRAM, such as data width of the DRAM or driving performance of a data output buffer, up to now. A quick and exact transmission of a signal (bit) to the outside according to the request of a CPU has been pursued. However, regarding DRAMs, a quick and exact transmission of data is more important than the transmission of a signal. A transmission of a data unit (referred to as a "packet" hereinafter) having a predetermined size, being more efficient than that of a signal of a bit unit, is on the rise. Under these circumstances, a packet-based DRAM such as a Rambus DRAM has been developed.

A Rambus protocol is a protocol in a Rambus channel which uses a source synchronous bus configuration synchronizing a travel direction of data with a direction of a clock. The Rambus protocol includes a base Rambus DRAM protocol, a concurrent Rambus DRAM protocol, and a direct Rambus DRAM protocol. The direct Rambus DRAM protocol uses an ROWA packet, a row command (referred to as an "ROWR") packet, a column command (referred to as a "COLC" hereinafter) packet, a column extended command (referred to as a "COLX" hereinafter) packet, and a COLM packet. Functions and configurations of the ROWA, ROWR, COLC, COLM, and COLX packets are different from one another. FIG. 1 is a diagram showing a configuration of a COLC+COLX packet in a conventional Rambus DRAM. In FIG. 1, the COLC packet of the COLC+COLX packet is indicated by bits located outside a dotted line. The COLX (or COLM) packet of the COLC+COLX packet is indicated by bits located inside the dotted line in FIG. 1. When M=1, the bits located inside the dotted line operate as a COLM packet and are used as a mask bit of writing data. When M=0, the bits located inside the dotted line operate as a COLX packet. When the bits located inside the dotted line operate as a COLX packet, the Rambus DRAM performs an operation such as a precharge, a current calibration, and a power conversion to a standby status.

In FIG. 1, DX0 to DX4 in the COLC+COLX packet are bits indicating whether COLX operation is performed by any device. BX0~BX4 in the COLC+COLX packet are bits indicating whether the COLX operation is performed in any bank of a device specified by DX0~DX4. XOP0~XOP4 are bits indicating whether any operation is performed in the bank of a device specified by DX0~DX4 and BX0~BX4. At this time, RsvB is not being used as a reserved bit. Table 1 shows command contents of the conventional COLX packet.

TABLE 1

| M | DX4~DX0 | XOP4~XOP0 | Title | Command contents |
|---|---|---|---|---|
| 1 | ... | — | MSK | MB/MA byte mask used by WR/WRA |
| 0 | /=(DEVID4...0) | — | — | No operation |
| 0 | =(DEVID4...0) | 00000 | NOXOP | No operation |
| 0 | =(DEVID4...0) | 1xxx0 | PREX | Precharge banks BX4 through BX0 of device |
| 0 | =(DEVID4...0) | x10x0 | CAL | Current IOL calibration of device |
| 0 | =(DEVID4...0) | x11x0 | CAL/SAM | IOL calibration and sampling of device |
| 0 | =(DEVID4...0) | xxx10 | RLXX | Change device into standby power status |
| 0 | =(DEVID4...0) | xxxx1 | RSRV | Reservation, no operation |

In order to implement a special mode register in a conventional Rambus DRAM, it is necessary to change the special mode register thereof to a control register mode. Also, a control register is used in a limited part such as current control of an output driver and control of a slew rate. The control register is processed by a metal layer option. In the conventional Rambus DRAM having the above configuration, in order to change the special mode register thereof to a control register mode or to additionally check a special part affecting the quality of memory, when a control register is used, embodiment of operations and adding/changing of circuits become complicated. When the control register is processed by the metal layer option, the cost and the time required for the process both increase.

SUMMARY OF THE INVENTION

Accordingly, the present invention has been made to solve the above-mentioned problems occurring in the prior art, and an object of the present invention is to provide a circuit for implementing a special mode in a packet-based semiconductor memory device which performs the special mode in the same manner as a normal operation without changing the semiconductor memory device from a special mode register to a control register mode prior to a normal operation or at the middle of a normal operation after an initial operation having a reset operation.

Another object of the present invention is to provide a circuit for implementing a special mode in a packet-based semiconductor memory device capable of performing additional special modes simply.

A further object of the present invention is to provide a circuit for implementing a special mode in a packet-based semiconductor memory device capable of reducing testing costs and testing time without using a physical metal layer option.

In accordance with an aspect of the present invention, there is provided a circuit for implementing a special mode in a packet-based semiconductor memory device, the circuit comprising: a packet receiving part for receiving external packet data; a register controller for generating a control signal to select a special mode register according to a value of a first field among the external packet data received by the packet receiving part; and a register value generator for generating a value of the special mode register selected by the control signal from the register controller according to a value of a second field among the received external packet data when the register controller generates the control signal.

Preferably, the register value generator includes a register value output means for outputting the second field value according to the control signal from the register controller and a register value decoder for decoding the second field value outputted by the register value output means.

In accordance with a further aspect of the present invention, there is provided a circuit for implementing a special mode in a Rambus dynamic access memory device, the circuit comprising: a packet receiving part for receiving external packet data; a register controller for generating a control signal to select a special mode register according to a value of a first field among the external packet data received by the packet receiving part; and a register value generator for generating a value of the special mode register selected by the control signal from the register controller according to a value of a second field among the received external packet data when the register controller generates the control signal.

Preferably, the register value generator includes a register value output means for outputting the second field value according to the control signal from the register controller and a register value decoder for decoding the second field value outputted by the register value output means.

More preferably, the first field or the second field includes at least one reserved bit. Most preferably, the register controller generates the control signal when the XOP value of the column extended packet received by the packet receiving part is one. Also, the control signal and the special mode register value are determined according to an XOP1 value, an XOP2 value, an XOP3 value, an XOP4 value, and a reserved bit value.

According to the present invention, prior to a normal operation or at the middle of a normal operation after an initializing operation, setting a special mode register and controlling a value of the special mode register, a packet-based semiconductor memory device is easily operated, suitable to a predetermined standard. A delay locked loop is not formed by the metal option. Instead, the packet-based semiconductor memory device is easily operated in a predetermined standard manner without changing a special mode register into another mode (a control register mode). Since an operation of the packet-based semiconductor device is easily detected by controlling the special mode register value, the cost and the time required for testing a device are reduced. Also, the packet-based semiconductor device simply performs additional special operations.

BRIEF DESCRIPTION OF THE DRAWINGS

The above and other objects, features and advantages of the present invention will be more apparent from the following detailed description taken in conjunction with the accompanying drawings, in which:

FIG. 3 is a view illustrating a case in which 2 bits are allotted to a special mode register selecting signal and 3 bits are allotted to a special mode register value;

FIG. 4 is a view illustrating a case in which 3 bits are allotted to a special mode register selecting signal and 2 bits are allotted to a special mode register value;

DETAILED DESCRIPTION OF THE PREFERRED EMBODIMENTS

Figure 1:
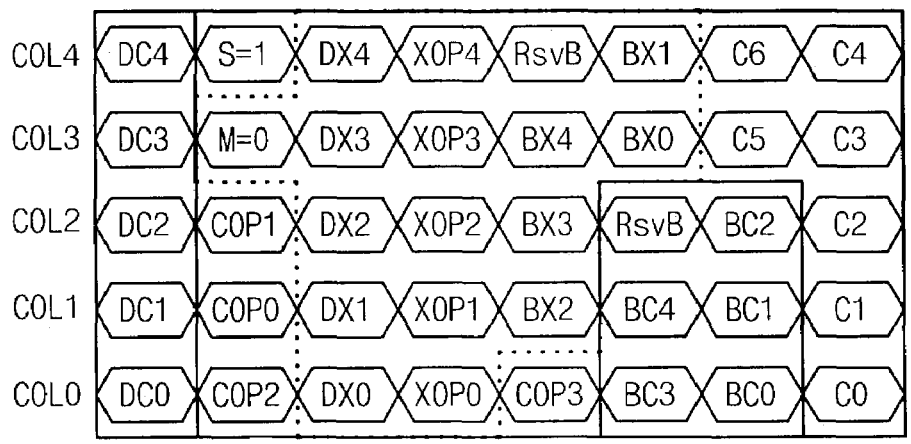
FIG. 1 is a diagram showing a configuration of a COLC+COLX packet in a conventional Rambus DRAM.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
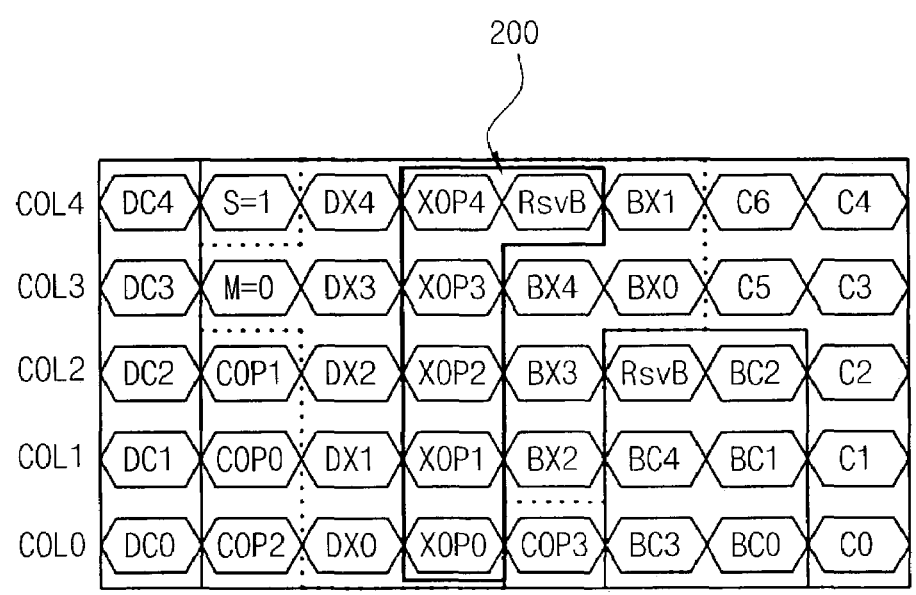
FIG. 2 is a diagram showing a configuration of a COLC+COLX packet used in an embodiment of the present invention.

FIG. 2 is a view showing a configuration of a COLC+COLX packet used in an embodiment of the present invention. In FIG. 2, bits located at the inside 200 of a thick solid line indicate bits used in an embodiment of the present invention in order to embody a special mode register (referred to as a "SMR" hereinafter). As shown in FIG. 2, XOP0~XOP4 bit, and an RsvB bit in a COLX packet are used. The following table 2 shows the command contents of the COLX packet according to the embodiment of the present invention.

TABLE 2

| M | DX4~DX0 | XOP4~XOP0 | Title | Command contents |
|---|---|---|---|---|
| 1 | ... | — | MSK | MB/MA byte mask used by WR/WRA |
| 0 | /=(DEVID4 . . 0) | — | — | No operation |
| 0 | =(DEVID4 . . 0) | 00000 | NOXOP | No operation |
| 0 | =(DEVID4 . . 0) | 1xxx0 | PREX | Precharge banks BX4 through BX0 of device |
| 0 | =(DEVID4 . . 0) | x10x0 | CAL | Current IOL calibration of device |
| 0 | =(DEVID4 . . 0) | x11x0 | CAL/SAM | IOL calibration and sampling of device |
| 0 | =(DEVID4 . . 0) | xxx10 | RLXX | Change device into standby power status |
| 0 | =(DEVID4 . . 0) | xxxx1 | SMR | Special mode register |

As shown in Table 2, conventionally, an XOP0 bit that is set to logic "1" (the row title of which is RSRV in Table 1) is not used. When logic "1" is set to the XOP0 bit of the COLX packet, the COLX packet is used to embody a special mode register according to the embodiment of the present invention. In order to select a predetermined special mode register among a plurality of special mode registers and to designate a value of the selected special mode register, XOP1~XOP4 bits and an RsvB bit are used.

The following table 3 is a table for a special mode register according to an embodiment of the present invention.

TABLE 3

| Designation of SMR value | Selection of SMR | XOP0 | The SMR value (i) | The number (n) of SMR |
|---|---|---|---|---|
| 1 | RsvB, XOP4, 3, 2 | XOP1 | 1 | 16 | 2 |
| 2 | RsvB, XOP4, 3 | XOP2, 1 | 1 | 8 | 4 |
| 3 | RsvB, XOP4 | XOP3, 2, 1 | 1 | 4 | 8 |
| 4 | RsvB | XOP4, 3, 2, 1 | 1 | 2 | 16 |

Referring to table 3, in the first case, the Rsvb bit and XOP 4~XOP2 bits are used to designate the value of a special mode register. Only the XOP1 bit is used to select the special mode register. Since 4 bits are used to designate the special mode register value, the SMR value (i) is 16, and one bit is used to select the special mode register. The number (n) of the special mode register is 2.

In the second case, the RsvB bit and XOP 4 and XOP3 bits are used to designate the value of a special mode register. XOP1 and XOP2 bits are used to select a special mode register. Since 3 bits are used to designate the special mode register value, the number (i) of SMR value is 8, and two bits are used to select the special mode register. The number (n) of the special mode register is 4.

Other cases are applied in the same manner as that in the first or second case.

FIG. 3 is a view illustrating a case where 2 bits are allotted to a special mode register selecting signal and 3 bits are allotted to a special mode register value (the second case in table 3). As shown in FIG. 3, the RsvB bit, the XOP4 bit, and the XOP3 bit are used to designate the value of a special mode register. The XOP2 and XOP1 bits are used to select one of four special mode registers. The XOP0 bit indicates a special mode. Consequently, when the XOP0 bit is logic "1", the special mode register is set regardless of the values of XOP2 and XOP1 bits. When (XOP2, XOP1) is logic (0, 0), a first special mode register SMR 1 is selected. When (XOP2, XOP1) is logic (0, 1), a second special mode register SMR 2 is selected. When (XOP2, XOP1) is logic (1, 0), a third special mode register SMR 3 is selected. When (XOP2, XOP1) is logic (1, 1), a fourth special mode register SMR 4 is selected.

FIG. 4 is a view illustrating a case where 3 bits are allotted to a special mode register selecting signal and 2 bits are allotted to a special mode register value (the fourth case in table 3). As shown in FIG. 4, the RsvB and XOP4 bits are used to designate the value of a special mode register. The XOP3~XOP1 bits are used to select one of eight special mode registers. The XOP0 bit indicates a special mode. When (XOP3, XOP2, XOP1) is logic (0, 0, 0), a first special mode register SMR 1 is selected. When (XOP3, XOP2, XOP1) is logic (0, 0, 1), a second special mode register SMR 2 is selected. When (XOP3, XOP2, XOP1) is logic (0, 1, 0), a third special mode register SMR 3 is selected. When (XOP3, XOP2, XOP1) is logic (0, 1, 1), a fourth special mode register SMR 4 is selected. When (XOP3, XOP2, XOP1) is logic (1, 0, 0), a fifth special mode register SMR 5 is selected. When (XOP3, XOP2, XOP1) is logic (1, 0, 1), a sixth special mode register SMR 6 is selected. When (XOP3, XOP2, XOP1) is logic (1, 1, 0), a seventh special mode register SMR 7 is selected. When (XOP3, XOP2, XOP1) is logic (1, 1, 1), an eighth special mode register SMR 8 is selected.

Figure 5:
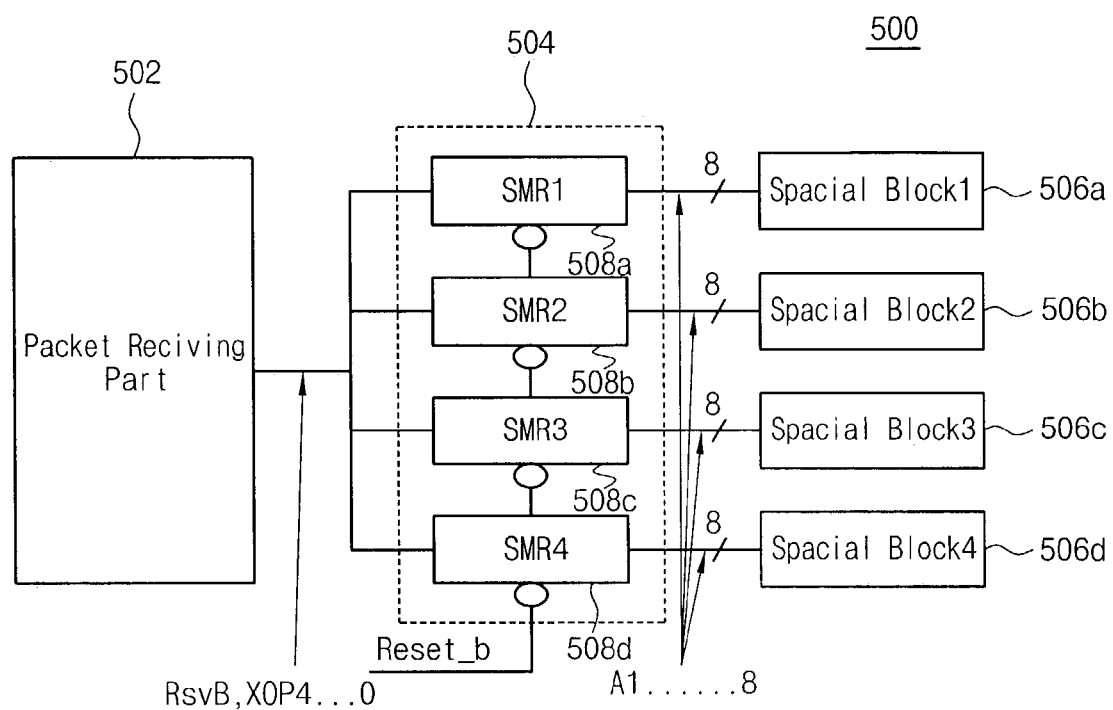
FIG. 5 is a block diagram showing a circuit for implementing a special mode in a packet-based semiconductor memory device according to an embodiment of the present invention.

FIG. 5 is a block diagram showing a circuit 500 for implementing a special mode in a packet-based semiconductor memory device according to an embodiment of the present invention. As shown in FIG. 5, the circuit 500 includes a COLX packet receiving part 502, a special mode register block 504, and special blocks 506a, 506b, 506c, and 506d. As stated above with reference to FIG. 3, the circuit 500 corresponds to the case where RsvB, XOP4, and XOP3 bits are used to designate a value of a special mode register, where XOP2 and XOP1 bits are used to select the special mode register, and where an XOP0 bit indicates a special mode. The COLK packet receiving part 502 receives external packet data. Accordingly, the special mode register block 504 includes four special mode registers 508a, 508b, 508c, and 508d. Each of the four special mode registers 508a, 508b, 508c, and 508d has eight different values A1, A2, . . . , A7, A8. The reset signal Reset_b is used to reset values of the four special mode registers 508a, 508b, 508c, and 508d.

Figure 6A:
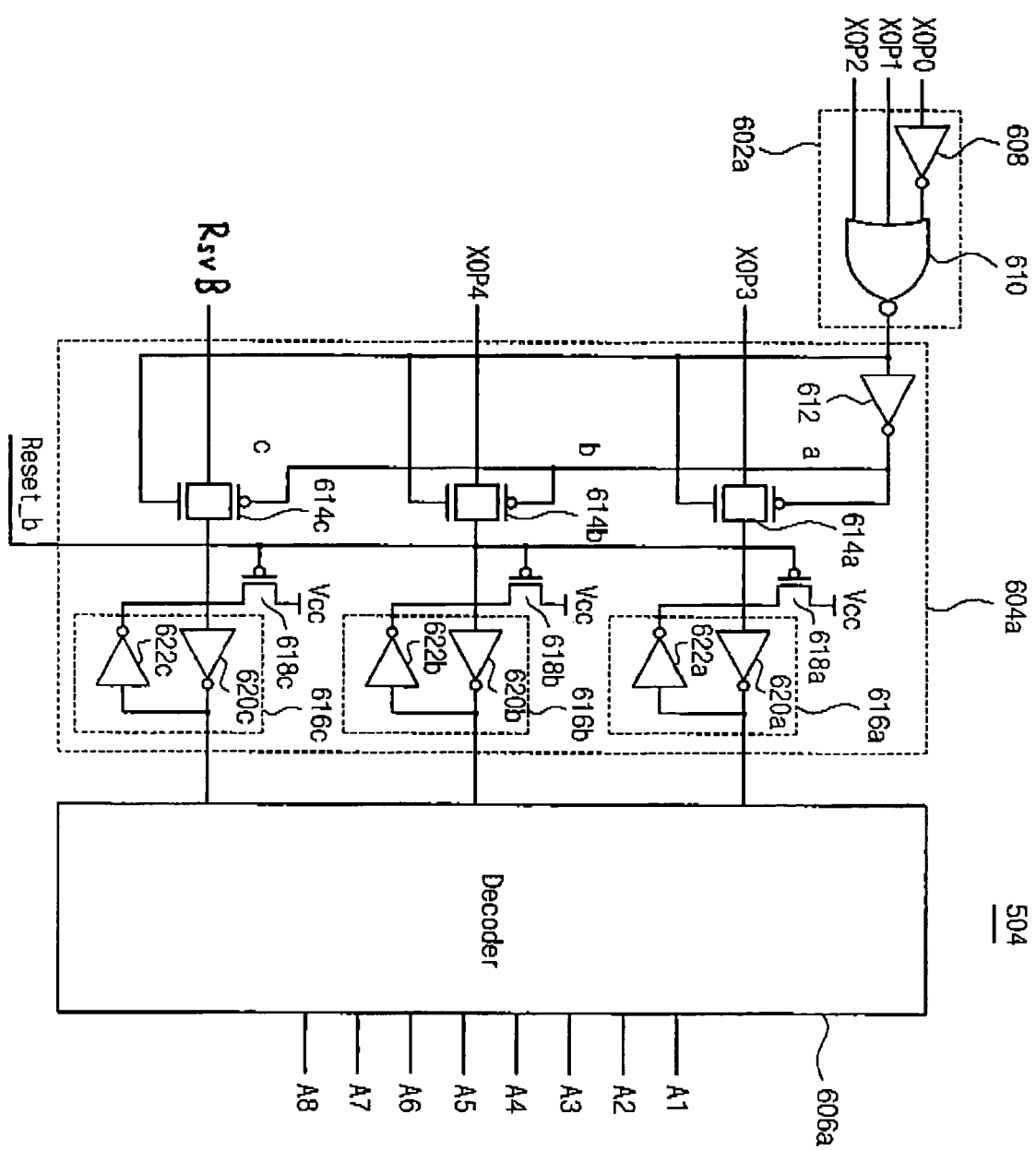
FIG. 6A is a block diagram showing one example of a first special register 508a of the special mode register block 504 shown in FIG. 5.

FIG. 6A is a block diagram showing one example of a first special register 508a of the special mode register block 504a shown in FIG. 5. As shown in FIG. 6A, the first special mode register 508a includes a register controller 602a and a register value generator. The register controller 602a generates a control signal to select a special mode register block 504 according to a value of a first field among the external packet data received by the packet receiving part 502. The register controller 602a includes an inverter 608 and a NOR gate 610. The inverter 608 inverts the value of an XOP0 bit and outputs the inverted XOPO bit value to an input terminal of the NOR gate 610. Only when (XOP2, XOP1, XOP0) is logic (0, 0, 1) does the NOR gate 610 output a logic "1" signal to the register value output section 604a. In cases other than the case the which (XOP2, XOP1, XOP0) is logic (0, 0, 1), the NOR gate 610 outputs a logic "0" signal to the register value output section 604a.

The register value generator generates a value of the special mode register selected by the control signal from the register controller 602a according to a value of a second field among the received external packet data when the register controller 602a generates the control signal. The register value generator includes a register value output section 604a and a register value decoder 606a. The register value output section 604a outputs the second field value according to the control signal from the register controller 602a. The register value output section 604a includes an inverter 612, a plurality of input sections, latches 616a, 616b, and 616c, and a plurality of reset sections. The plurality of input sections input the second field value among the received external packet data in response to the control signal from the register controller 602a. The input sections have transfer gates 614a, 614b, and 614c. The reset sections include PMOS transistors 618a, 618b, and 618c. Although FIG. 6A indicates three transfer gates 614a, 614b, and 614c; three latches 616a, 616b, and 616c; and three PMOS transistors 614a, 614b, and 614c, there may be three or more of each of the transfer gates, latches, and PMOS transistors. The register value decoder 606a decodes the second field value outputted by the register value output section 604a.

At first, when the NOR gate 610 outputs a logic "0" signal, in the register value output section 604a, since the logic "0" signal from the NOR gate 610 is inputted to non-inverting control terminals of the transfer gates 614a, 614b, and 614c, and the inverter 612 inverts the logic "0" signal into a logic "1" signal and since the logic "1" signal from the inverter 612 is inputted to inverting control terminals thereof, the transfer gates 614a, 614b, and 614c do not transfer XOP3, XOP4, and RsvB bits provided through their input terminals to their output terminals.

Secondly, when the NOR gate 610 outputs a logic "1" signal, in the register value output section 604a, since the logic "1" signal from the NOR gate 610 is inputted to non-inverting control terminals of the transfer gates 614a, 614b, and 614c, since the inverter inverts the logic "1" signal into a logic "0" signal, and since the logic "0" signal from the inverter 612 is inputted to inverting control terminals thereof, the transfer gates 614a, 614b, and 614c transfer XOP3, XOP4, and RsvB bits provided through input terminals thereof to output terminals and provide the transferred XOP3, XOP4, and RsvB bits to the latches 616a, 616b, and 616c.

The latches 616a, 616b, and 616c latch outputs of the transfer gates 614a, 614b, and 614c, respectively and output latched values. Each of the latches 616a, 616b, and 616c includes a pair of inverters in such a way that an output terminal of one inverter is connected to an input terminal of the other inverter, and an output terminal of the other inverter is connected to an input terminal of the one inverter. The latch 616a includes a pair of inverters 620a and 622a. The latch 616b includes a pair of inverters 620b and 622b. The latch 616c includes a pair of inverters 620c and 622c. The latch 616a, 616b, and 616c are connected to PMOS transistors 618a, 618b, and 618c, respectively. The PMOS transistors 618a, 618b, and 618c reset values of the latches 616a, 616b, and 616c, respectively.

As shown in FIG. 6A, a reset signal Reset_b is applied to each gate of the PMOS transistors 618a, 618b, and 618c. A source voltage is supplied to each source of the PMOS transistors 618a, 618b, and 618c. Each of the PMOS transistors 618a, 618b, and 618c are connected to input terminals of the latches 616a, 616b, and 616c, respectively. Consequently, when the reset signal Reset_b is logic "0", the PMOS transistors 618a, 618b, and 618c are turned on and provide logic "1" signals to the latches 616a, 616b, and 616c, respectively.

The values latched by the latches 616a, 616b, and 616c are provided to a register value decoder 606a. The register value decoder 606 decodes the latched values from the latches 616a, 616b, and 616c. The register value decoder 606a outputs eight output signals A1~A8 according to the latched values from the latches 616a, 616b, and 616c. One of the eight output signals has a logic "1" value, and the rest thereof have logic "0" values.

Figure 6B:
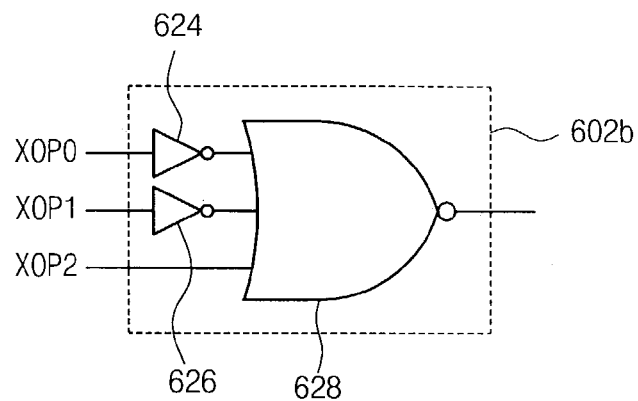
FIG. 6B is a block diagram showing one example of a register controller 602b of a second special register 508b of the special mode register block 504 shown in FIG. 5.

FIG. 6B is a circuitry diagram showing one example of a register controller 602b of a second special register 508b of the special mode register block 504 shown in FIG. 5. The register controller 602b includes two inverters 624 and 626, and a NOR gate 628. The inverter 624 inverts an input XOP0 bit and outputs the inverted XOPO bit to a first input terminal of the NOR gate 628. The inverter 626 inverts an input XOP1 bit and outputs the inverted XOP1 bit to a second input terminal of the NOR gate 628. Consequently, only when (XOP2, XOP1, XOP0) is logic (0, 1, 1) does the NOR gate 628 output a logic "1" signal. In cases other than the case in which (XOP2, XOP1, XOP0) is logic (0, 1, 1), the NOR gate 628 outputs a logic "0" signal. As a result, only when (XOP2, XOP1, XOP0) are logic (0, 1, 1) does the register controller 602b activate a corresponding register value output section (not shown), thus causing it to output a register value.

Figure 6C:
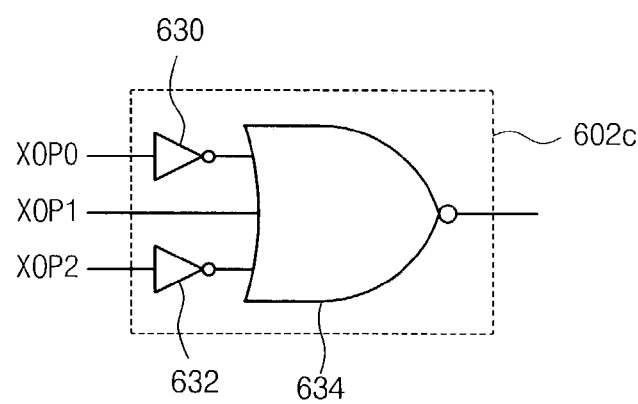
FIG. 6C is a block diagram showing one example of a register controller 602c of a third special register 508c of the special mode register block 504 shown in FIG. 5.

FIG. 6C is a circuitry diagram showing one example of a register controller 602c of a third special register 508c of the special mode register block 504 shown in FIG. 5. The register controller 602c includes two inverters 630 and 632, and a NOR gate 634. The inverter 630 inverts an input XOP0 bit and outputs the inverted XOPO bit to a first input terminal of the NOR gate 634. The inverter 632 inverts an input XOP2 bit and outputs the inverted XOP2 bit to a second input terminal of the NOR gate 634. Consequently, only when (XOP2, XOP1, XOP0) is logic (1, 0, 1) does the NOR gate 634 output a logic "1" signal. In the cases other than the case in which (XOP2, XOP1, XOP0) is logic (1, 0, 1), the NOR gate 634 outputs a signal of "0". As a result, only when (XOP2, XOP1, XOP0) is logic (1, 0, 1) does the register controller 602c activate a corresponding register value output section (not shown), causing it to output a register value.

Figure 6D:
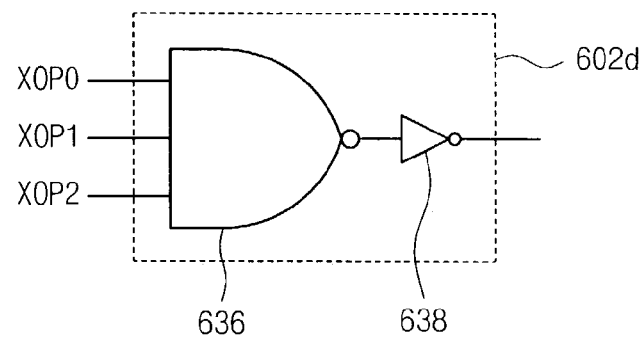
FIG. 6D is a block diagram showing one example of a register controller 602d of a second special register 508d of the special mode register block 504 shown in FIG. 5.

FIG. 6D is a circuitry diagram showing one example of a register controller 602d of a fourth special register 508d of the special mode register block 504 shown in FIG. 5. The register controller 602d includes an NAND gate 636 and an inverter 638. The NAND gate 636 NANDs XOPO, XOP1, and XOP2 bits. The inverter 638 inverts an output of the NAND gate 636. Consequently, only when (XOP2, XOP1, XOP0) is logic (1, 1, 1) does the NAND gate 636 output a logic "0" signal. The inverter 638 inverts the logic "0" signal from the NAND gate 636 and outputs a logic "1" signal. In the cases other than the case in which (XOP2, XOP1, XOP0) is logic (1, 1, 1) does the NAND gate 636 output a logic "1" signal. The inverter 638 inverts the logic "1" signal from the NAND gate 636 and outputs a logic "0" signal. As a result, only when (XOP2, XOP1, XOP0) is logic (1, 1, 1) does the register controller 602d activate a corresponding register value output section (not shown), thus causing it to output a register value.

According to the present invention, prior to a normal operation or at the middle of the normal operation after an initial operation, by setting a special mode register and by controlling a value of the special mode register, a packet-based semiconductor memory device is easily operated in a predetermined standard manner. A delay locked loop is not formed by the metal option. Instead, the packet-based semiconductor memory device is easily operated in a predetermined standard manner without changing a special mode register into another mode (such as a control register mode). Since an operation of the packet-based semiconductor device is easily detected by controlling the special mode register value, the cost and the time required for testing a device are reduced. Also, the packet-based semiconductor device performs additional special operations simply.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A circuit for implementing a special mode in a packet-based semiconductor memory device, the circuit comprising:
 a packet receiving part for receiving external packet data
  a register controller for generating a control signal to select a special mode register according to a value of a first field among the external packet data received by the packet receiving part; and
 a register value generator for generating a value of the special mode register selected by the control signal from the register controller according to a value of a second field among the received external packet data when the register controller generates the control signal.

2. The circuit according to claim 1, wherein the register value generator includes:
   a register value output means for outputting the second field value according to the control signal from the register controller; and
   a register value decoder for decoding the second field value outputted by the register value output means.

3. The circuit according to claim 2, wherein the register value output means includes:
   a plurality of input sections for inputting the second filed value among the received external packet data in response to the control signal from the register controller;
   a plurality of latches for latching the second filed value inputted by the plurality of input sections and outputting the latched values; and
   a plurality of reset sections for resetting the latched values from the plurality of latches in response to a rest signal.

4. The circuit according to claim 3, wherein the input sections each include a plurality of transfer gates for transferring the second field value in response to an inverting signal of the control signal from the register controller.

5. The circuit according to claim 3, wherein the latches each include:
   a first inverter for receiving the second field value and outputting a first inverted signal; and
   a second inverter for inverting the first inverted signal from the first inverter and outputting a second inverted signal to an input terminal of the first inverter.

6. The circuit according to claim 5, wherein the reset sections are each coupled between a power supply terminal and an output terminal of the second inverter and are operated according to the reset signal.

7. The circuit according to claim 3, wherein the first field or the second field includes at least one reserved bit.

8. The circuit according to claim 3, wherein the register controller generates the control signal when the packet received by the packet receiving part is a column extended command packet.

9. The circuit according to claim 3, wherein the register controller generates the control signal when an XOP value of the column extended packet received by the packet receiving part is one.

10. The circuit according to claim 3, wherein the control signal and the special mode register value are determined according to an XOP1 value, an XOP2 value, an XOP3 value, an XOP4 value, and a reserved bit value.

11. A circuit for Implementing a special mode in a Rambus dynamic access memory device, the circuit comprising:
    a packet receiving part for receiving external packet data;
    a register controller for generating a control signal to select a special mode register according to a value of a first field among the external packet data received by the packet receiving part; and
    a register value generator for generating a value of the special mode register selected by the control signal from the register controller according to a value of a second field among the received external packet data when the register controller generates the control signal.

12. The circuit according to claim 11 wherein the register value generator includes:
    a register value output means for outputting the second field value according to the control signal from the register controller; and
    a register value decoder for decoding the second field value outputted by the register value output means.

13. The circuit according to claim 11, wherein the first field or the second field includes at least one reserved bit.

14. The circuit according to claim 11, wherein the register controller generates the control signal when the packet received by the packet receiving part is a column extended command packet.

15. The circuit according to claim 14, wherein the register controller generates the control signal when an XOP value of the column extended packet received by the packet receiving part is one.

16. The circuit according to claim 15, wherein the control signal and the special mode register value are determined according to an XOP1 value, an XOP2 value, an XOP3 value, an XOP4 value, and a reserved bit value.

* * * * *